US011309382B2

(12) United States Patent
Bouvier et al.

(10) Patent No.: US 11,309,382 B2
(45) Date of Patent: Apr. 19, 2022

(54) ELECTRONIC PRODUCT COMPRISING A COMPONENT HAVING TRISKELION-PILLARS, AND CORRESPONDING FABRICATION METHOD

(71) Applicant: Murata Manufacturing Co., Ltd., Nagaokakyo (JP)

(72) Inventors: Stéphane Bouvier, Cairon (FR); Florent Lallemand, Villers-Canivet (FR)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 0 days.

(21) Appl. No.: 17/072,410

(22) Filed: Oct. 16, 2020

(65) Prior Publication Data
US 2021/0036099 A1 Feb. 4, 2021

Related U.S. Application Data

(63) Continuation of application No. PCT/IB2019/000294, filed on Apr. 26, 2019.

(30) Foreign Application Priority Data

Apr. 26, 2018 (EP) .................................... 18305520

(51) Int. Cl.
*H01L 49/02* (2006.01)
*H01L 27/08* (2006.01)
(Continued)

(52) U.S. Cl.
CPC .......... *H01L 28/87* (2013.01); *H01L 21/3083* (2013.01); *H01L 27/0805* (2013.01);
(Continued)

(58) Field of Classification Search
CPC ... H01L 28/87; H01L 29/94; H01L 29/66181; H01L 27/0805; H01L 21/3083; H01L 28/91
See application file for complete search history.

(56) References Cited

U.S. PATENT DOCUMENTS 8,283,750 B2   10/2012  Guiraud et al.
2007/0141163 A1*  6/2007  Vitaliano ............. A61K 9/5169
                                                           424/490
(Continued)

FOREIGN PATENT DOCUMENTS

WO     2007125510 A2     11/2007

OTHER PUBLICATIONS

International Search Report issued for PCT/IB2019/000294, dated Jul. 8, 2019.
(Continued)

*Primary Examiner* — Ahmed N Sefer
(74) *Attorney, Agent, or Firm* — ArentFox Schiff LLP

(57) ABSTRACT

An electronic product that includes a component having a first electrode with a first surface and a pillar extending from the first surface in a first direction, the pillar having three protrusions, the three protrusions forming angles of about 120 degrees with each other around a central line of the pillar where the three protrusions meet, and the three protrusions being bent so that the pillar has a triskelion cross-section in a plane perpendicular to the first direction.

20 Claims, 5 Drawing Sheets

(51) Int. Cl.
*H01L 29/94* (2006.01)
*H01L 21/308* (2006.01)
*H01L 29/66* (2006.01)

(52) U.S. Cl.
CPC .............. *H01L 28/91* (2013.01); *H01L 29/94* (2013.01); *H01L 29/66181* (2013.01)

(56) References Cited

U.S. PATENT DOCUMENTS

| | | | |
|---|---|---|---|
| 2010/0230787 A1* | 9/2010 | Guiraud | H01L 29/66181 257/532 |
| 2011/0244302 A1 | 10/2011 | Wasson | |
| 2012/0002346 A1* | 1/2012 | Takagaki | H01G 4/015 361/301.4 |
| 2013/0155012 A1* | 6/2013 | Chang | G06F 3/0448 345/174 |
| 2019/0035880 A1* | 1/2019 | Voiron | H01L 28/91 |

OTHER PUBLICATIONS

Written Opinion of the International Searching Authority issued for PCT/IB2019/000294, dated Jul. 8, 2019.
European Search Report issued for EP18305520.1, dated Oct. 18, 2018.

* cited by examiner

ELECTRONIC PRODUCT COMPRISING A COMPONENT HAVING TRISKELION-PILLARS, AND CORRESPONDING FABRICATION METHOD

CROSS REFERENCE TO RELATED APPLICATIONS

The present application is a continuation of International application No. PCT/IB2019/000294, filed Apr. 26, 2019, which claims priority to European Patent Application No. 18305520.1, filed Apr. 26, 2018, the entire contents of each of which are incorporated herein by reference.

FIELD OF THE INVENTION

The present invention relates to the field of integration and, more particularly, to electronic products, related semiconductor products, and their methods of manufacture.

The present invention more precisely relates to electronic components comprising electrodes such as capacitors.

TECHNICAL BACKGROUND

Electronic components such as capacitors may be integrated into semiconductor products in a variety of forms. For example, planar capacitors may be formed above semiconductor substrates by forming two planar electrodes separated by a dielectric layer. However planar capacitors provide low capacitance density, this implies that a high value capacitance will consume a significant area of silicon.

To overcome this issue, it has been proposed to form three-dimensional structures to increase the capacitance of a capacitor using the same surface area of the semiconductor substrates. Capacitance densities of the order of a Farad per $m^2$ have been achieved using three-dimensional capacitors. Fabrication of three-dimensional capacitors has been made possible through the introduction of manufacturing methods that form high aspect ratio structures such as Deep Reactive Ion Etching, better known under the acronym DRIE.

Initially, it has been proposed to form a matrix of deep holes in a silicon substrate. These holes could have openings of the order of 1 micrometer and a depth of up to 17 micrometers. The silicon in which the holes are formed is doped (either before the formation of holes or after in a deposition/diffusion process) so that the walls, the bottoms, and the top of the holes form a first electrode. A dielectric layer is deposited in a conformal manner and a second electrode is also deposited in a conformal manner so as to fill the holes and form a capacitor.

While this structure is particularly robust (in terms of mechanical robustness), it is also limited by the etching rates of the processes used to form the holes. This is caused by the reduced etching apertures and prevents the formation of deeper holes in an economical manner.

An alternative structure has been proposed in which bottom electrodes are formed in the shape of silicon pillars. In other words, the structure is a negative of the structure comprising holes.

The etching rate is consequently improved, but it has been observed that the mechanical robustness of this structure is poor as the pillars may bend prior to the deposition of the dielectric and of the upper electrode. Bent pillars may come into contact with each other and stick to each other. This generates process issues that can decrease capacitance density, increase the capacitor leakage current and even degrade the breakdown voltage by generating early failures.

Prior art document U.S. Pat. No. 8,283,750 discloses known three-dimensional capacitor structures using pillars with improved robustness so as to reduce sticking between pillars. There pillars may have three protrusions so that their cross-section is in the shape of a tripod.

The solutions of document U.S. Pat. No. 8,283,750 merely allow obtaining pillars having an aspect ratio of about 30 (the aspect ratio may be defined as the length of a pillar divided by the smallest cross-sectional dimension measured perpendicularly to its length direction). It has been observed that greater aspect ratios still lead to bended pillars and too much sticking.

Documents US 2011/244302 and WO 2007/125510 also disclose known pillar structures.

The present invention has been made in the light of the above problems.

SUMMARY OF THE INVENTION

The present invention provides an electronic product comprising a component having a first electrode comprising a first surface and a pillar extending from the first surface in a first direction, the pillar comprising three protrusions, the three protrusions forming angles of about 120 degrees with each other around a central line of the pillar where the three protrusions meet, and the three protrusions being bent in the same direction so that the pillar has a triskelion cross-section in a plane perpendicular to the first direction.

A triskelion is a shape comprising three legs or three branches (the protrusions of the invention) curved in the same direction (for example clockwise or counterclockwise) around a center (here the central line of the pillar where the three protrusions meet).

By way of example, triskelions are often used as Celtic symbols (with spiral legs).

The inventors of the present invention have observed that by bending the protrusions emerging from a pillar, the mechanical robustness of the pillar is improved and this prevents bending of the pillar.

The choice of the triskelion shape (with three bends oriented similarly) provides the following advantages: a compact structure is obtained, which allows maintaining the surface area of the first electrode, and this structure can be arranged in a matrix without loss of space between the structures, thus maintaining a high capacitance density.

According to a particular embodiment, the pillar has an aspect ratio greater than 60, or preferably greater than 100.

It has been observed that aspect ratios of 60 or 100 can be achieved using pillars having cross-sections in the shape of a triskelion, while the methods of the prior art lead to too much sticking at an aspect ratio of 50.

It should be noted that the aspect ratio of a pillar according to the present invention may be mainly limited by the cost of realizing deep structures (time/gaz), the uniformity of doping steps, the uniformity of subsequent dielectric depositions, the wafer warpage (after the filling of the deep trenches), and by the final die thickness (the final die thickness may be lower than 100 micrometers). It should be noted that an aspect ratio is, in the present description, the length of a pillar (measured in the first direction—or the depth of a trench delimiting a pillar) divided by the smallest cross-sectional dimension measured perpendicularly to its length direction (for example the width of a trench between two protrusions or two pillars).

According to a particular embodiment, the protrusions each comprise three segments each having the same length (or approximately the same length) and joined by angles of about 120 degrees.

It has been observed that this arrangement facilitates placing the pillar in a matrix of pillars.

According to a particular embodiment, the electronic product comprises a plurality of pillars, each central line of a pillar being arranged at a vertex of a planar equilateral triangular tessellation formed in a plane perpendicular to the first direction.

This arrangement of pillars is very advantageous as regards the surface area of the first electrode. This arrangement is possible because a triskelion arrangement has a substantially triangular shape.

It has been observed that the arrangement of the pillars in a matrix also participates in reducing wafer warpage or limits stress because the structure of each extends in three directions and comprises bends. This limits the amount of parallel linear trenches aligned in the same direction which may cause significant wafer warpage.

According to a particular embodiment, the pillars each have the same orientation.

The pillars are all extending in the first direction and the protrusions of each pillar are arranged so that this same orientation is obtained. This facilitates the arrangement in a matrix and increases the surface area of the electrodes (for example the first electrodes).

According to a particular embodiment, the smallest distance between two parallel segments of protrusions of adjacent pillars is approximately equal to the smallest distance between two parallel segments of protrusions of a same pillar.

In this embodiment, the protrusions of the pillars comprise segments.

This smallest distance (between two parallel segments of two adjacent pillars or between two parallel segments of a same pillar) may be the distance known to the skilled person as the critical dimension (for example the critical dimension of a DRIE step).

This embodiment is advantageous regarding the conformity of the subsequent deposition of materials. For example, if a capacitor is formed, a dielectric will be deposited in a conformal manner and a second electrode will also be deposited in a conformal manner. This ensures that there will be no large spaces between the pillars to be filled with a filling material.

According to a particular embodiment, the protrusions are formed of segments each having a width equal to said smallest distance (i.e. the smallest distance between two parallel segments of two adjacent pillars or between two parallel segments of a same pillar).

According to a particular embodiment, the cross section of the pillar is the same along the entire length of the pillar in the first direction.

According to a particular embodiment, the pillar has a length which is greater than 60 micrometers.

According to a particular embodiment, the first electrode is a first electrode of a capacitor of the electronic product.

In other words, a dielectric layer may be deposited on the first electrode, for example in a conformal manner, and a second electrode may be deposited on the dielectric layer.

The invention also provides a system comprising an electronic product as defined above.

The invention also provides a method for fabricating an electronic component as defined above.

By way of example, this method may comprise a DRIE step to form the pillar(s). Also, a photolithography step using a mask defining the triskelion-shape of the cross-section of the pillars may also be carried out in this method.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF EXAMPLE EMBODIMENTS

An electronic product having a first electrode will now be described according to an embodiment. More precisely, the steps for fabricating this electronic product according to an embodiment will be described hereinafter.

Figure 1A:
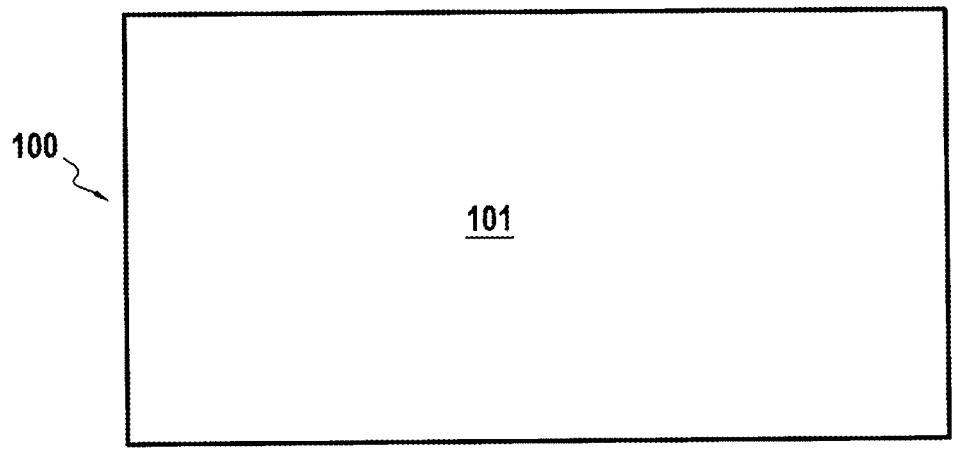
FIGS. 1A and 1B show a semiconductor substrate in which pillars will be formed according to an example.
Figure 1B:
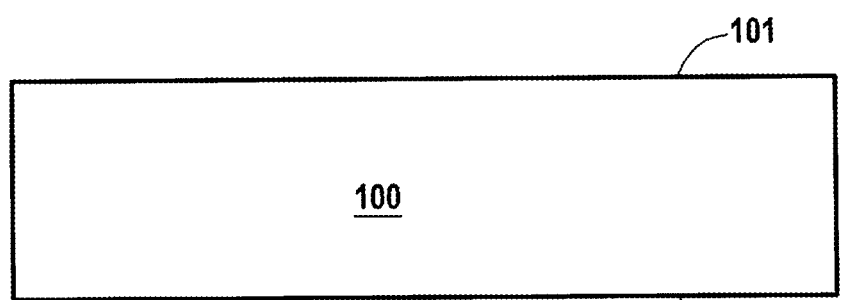

FIG. 1A is a top view of a semi-conductor substrate 100, and in this example the substrate is a silicon substrate, and FIG. 1B is a cross-section view of the substrate 100. The invention is however not limited to silicon substrates and also applies to other types of materials.

The silicon substrate 100 comprises a top surface 101 and a bottom surface 102 (the wordings top and bottom may of course be interchangeable).

It is from the top surface 101 that fabrication processes will carried out to form a first electrode. More precisely, a DRIE step may be carried out on the top surface 101 to delimit pillars forming at first electrode, as will be described in reference to FIGS. 2A and 2B.

Figure 2A:
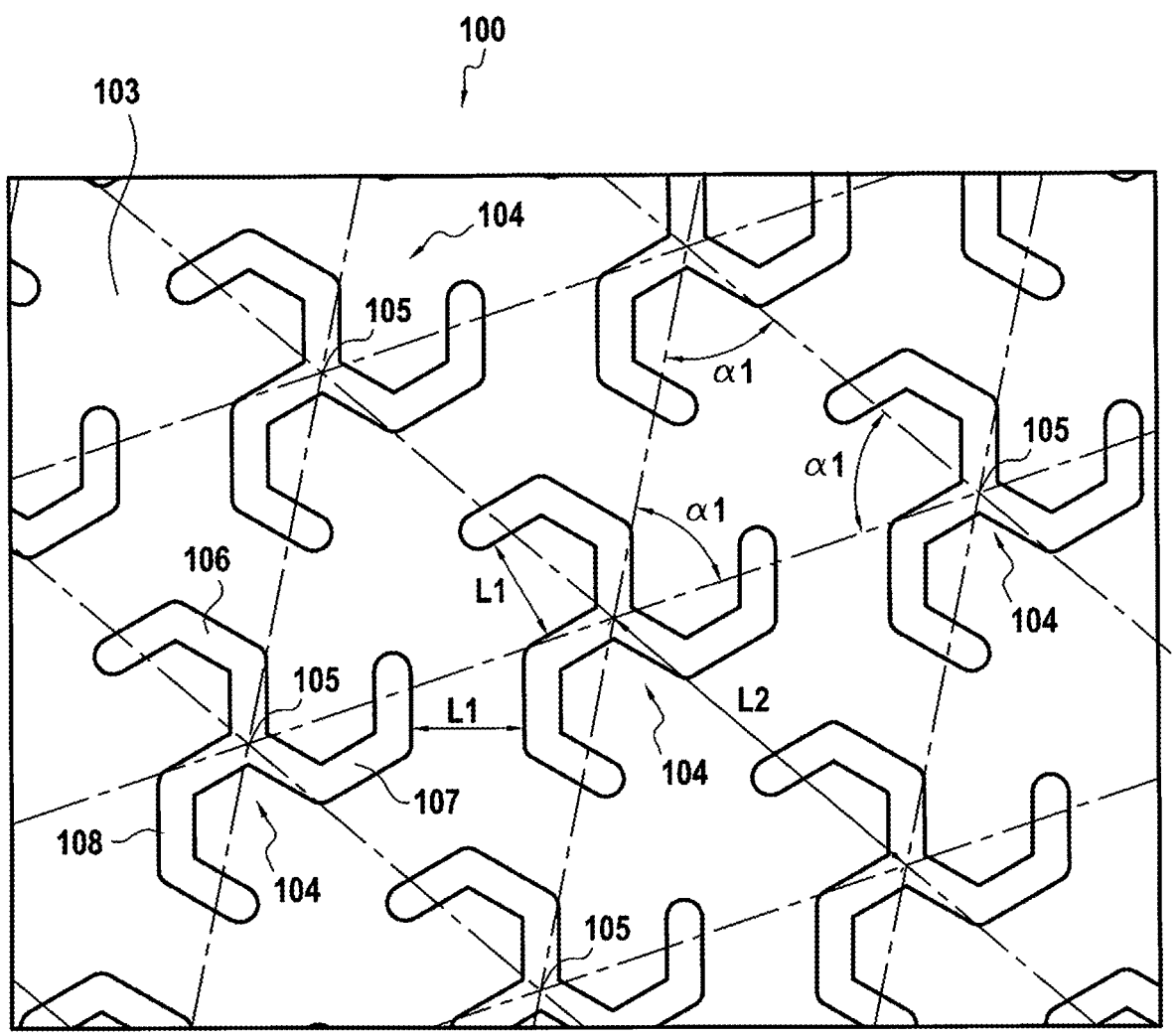
FIGS. 2A, 2B, 2C and 2D show the pillars.

FIG. 2A represents a top view of the substrate 100 after this DRIE step has been carried out. This step may include a prior photolithography step using a mask on which a matrix of triskelions has been formed so that the areas covered because of the photolithography step are in the shape of triskelion. The DRIE step is carried out until a chosen depth has been reached outside of the covered areas to reach a first surface 103 visible on FIG. 2A.

A plurality of pillars 104 is thus formed and these pillars extend from the first surface in a first direction. This first direction is perpendicular to the first surface.

The pillars comprise a central line 105 which goes through the center of each cross-section of the pillars in the first direction. Because the cross-section of the pillars is the same all along the first direction, the central lines are perpendicular to the first surface 103

Each pillar 104 is identical and comprises three protrusions 106, 107, and 108. The structure of a pillar will be described hereinafter in more detail in reference to FIG. 2B.

The pillars 104 are arranged so that each central line of a pillar is arranged at a vertex of a planar equilateral triangular tessellation T formed in a plane perpendicular to the first direction. The tessellation T is represented on FIG. 2A using dot-dash lines. The tessellation T being an equilateral triangular tessellation, the angles of each triangle corner are all equal (60 degrees) and referenced by the same reference al.

The pillars all have the same orientation and this is visible from the top view of FIG. 2A. This facilitates the arrangement of pillars on the tessellation T. The distance between each central line of pillars is referenced as L2 and this distance may be chosen so that a critical dimension is respected between two parallel segments of two protrusions respectively belonging to two adjacent pillars. This critical dimension is referenced L1 on the figure and it is the smallest distance between two parallel segments of adjacent pillars. It should be noted that this critical dimension L1 is preferably also the smallest distance between two parallel segments of protrusions of a same pillar, as shown on the figure.

It should be noted that not only is L1 the smallest distance between the pillars, it is also the largest distance between the pillars so that the formation of the pillars implies that trenches having a width of L1 are formed. This facilitates the subsequent conformal deposition of materials.

Figure 2B:
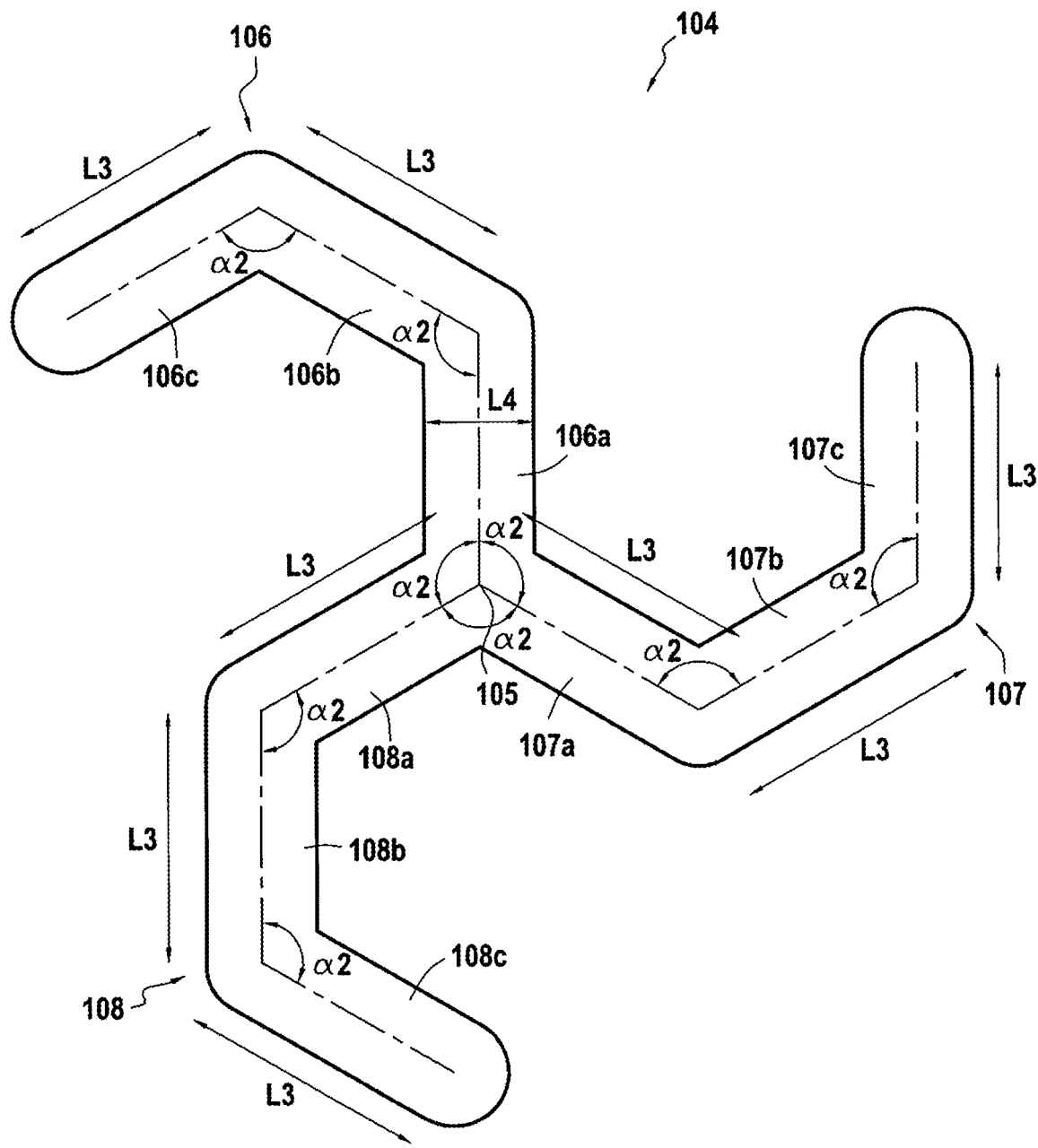

FIG. 2B shows a pillar 104 of FIG. 2A in more detail. As can be seen on this figure, the pillar 104 comprises the three protrusions 106, 107, and 108 which meet at the central line 105 and form angles α2 of about 120 degrees with each other. The three protrusions are also bent so that the pillar 104 has a triskelion cross-section in a plane perpendicular to the first direction, i.e. the plane of the figure.

The protrusion 106 comprises three segments 106a, 106b and 106c which have the same length L3 and which are joined by angles α2 of about 120 degrees. It should be noted that the angle between the protrusions and between the segments of a protrusions are the same angle α2 of about 120 degrees.

The protrusion 107 also comprises three segments 107a, 107b, and 107c arranged similarly and the protrusion 108 also comprises three segments 108a, 108b, and 108b arranged similarly.

All the segments of the triskelion have a width L4 which may also be chosen in order to respect the critical dimension L1 described in reference to FIG. 2A.

In fact, all the distances L1 to L3 and the width L4 may be chosen by the person skilled in the art so as to increase the surface area of the first electrode formed by the surface of the pillars 104, while respecting the limits of the photolithography and DRIE steps.

By way of example, L1 may be of the order of 1 micrometer, L2 may be of the order of 6 micrometers, L3 may be of the order of 1.5 micrometer, and L4 may be of the order of 1 micrometer.

It should be noted that while the pillar 104 has well defined segments and corners on this schematic figure, the actual pillar formed on a substrate may have more rounded corners.

Figure 2C:
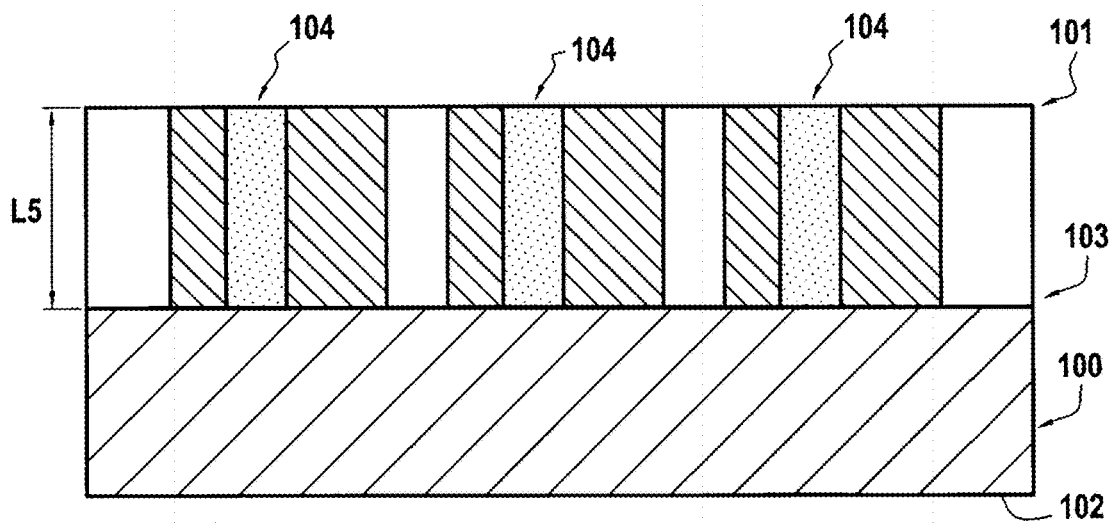

FIG. 2C shows a cross-section of the structure of FIG. 2A on which three pillars 104 are shown. As can be seen on this figure the DRIE step has formed pillars which have a length L5 and which extend from the first surface 103 to the top surface 101.

The aspect ratio of the pillars can be calculated as L1/L5, and this aspect ratio is preferably greater than 60. For example, the length of the pillars can be greater than 60 micrometer and the width L1 may be of the order of a micrometer.

Figure 2D:
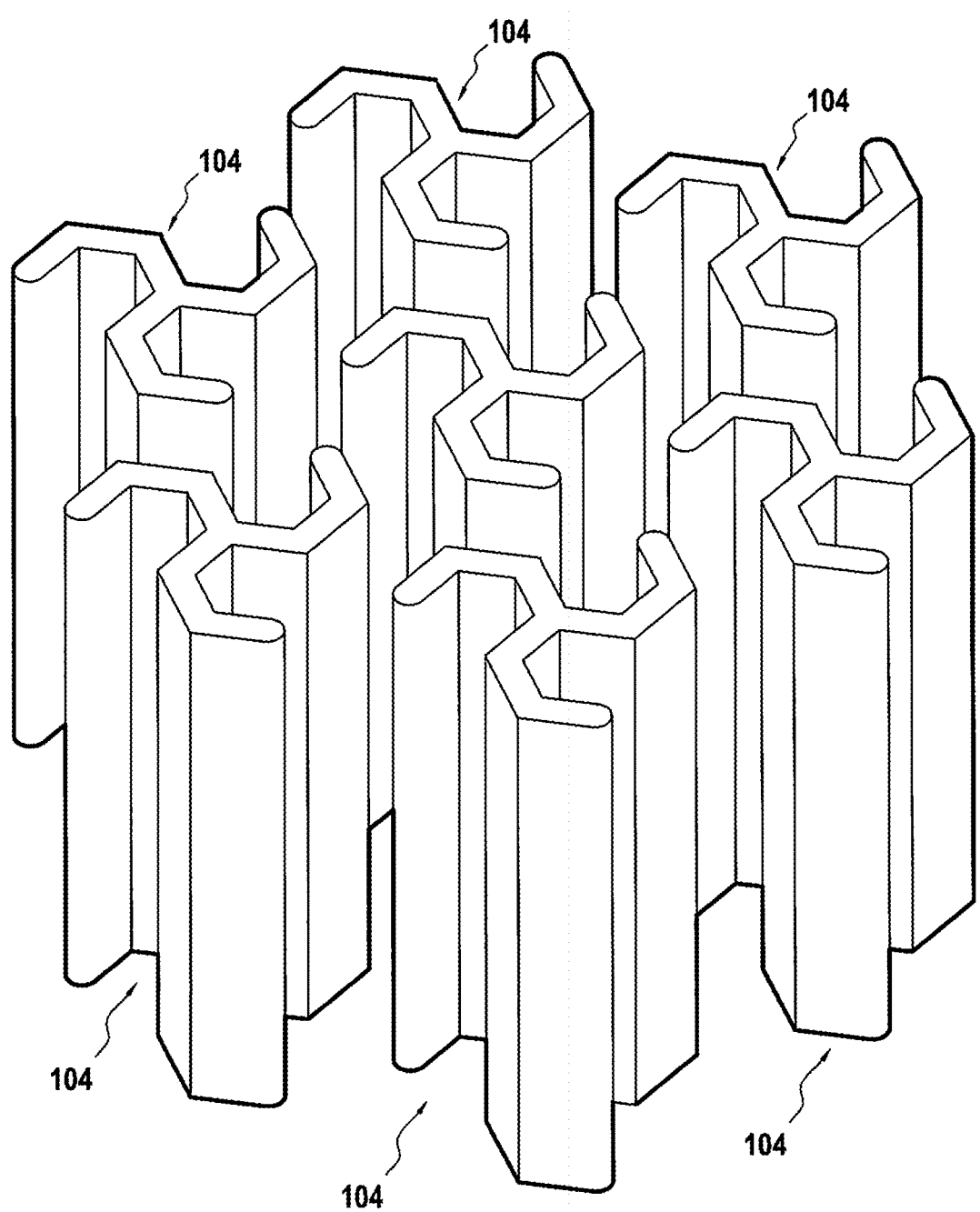

FIG. 2D is a perspective view of the pillars 104.

It should be noted that the pillars 104 and the first surface 103 may form a first electrode of a component such as a capacitor. The formation of a capacitor will be described hereinafter. It should be noted that the pillars 104 and the first surface may comprise doped silicon so as to behave as a metallic electrode. The doping of these structures may be realized prior to the formation of the pillars or after the formation of the pillars using a process which may be chosen by the person skilled in the art.

Figure 3:
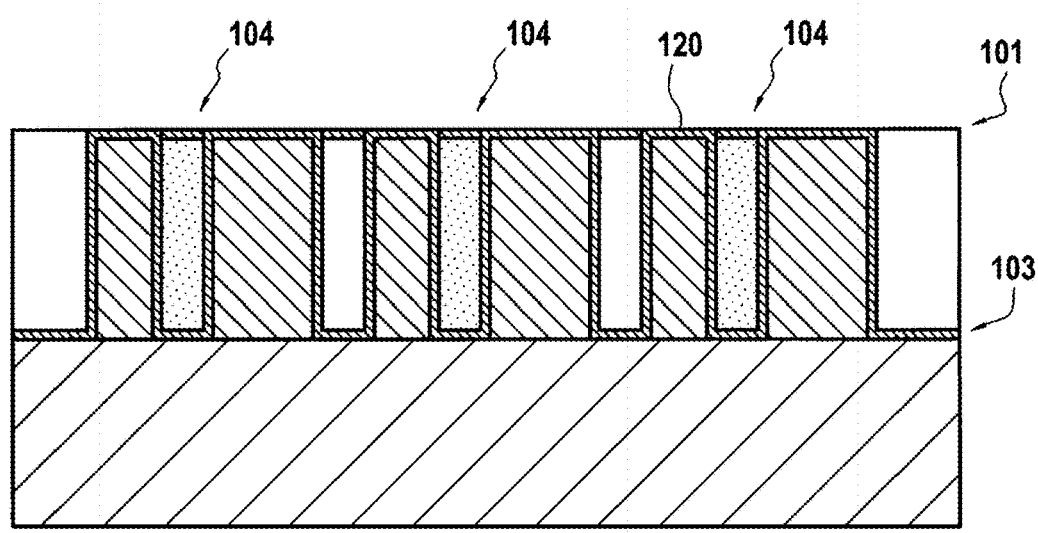
FIG. 3 shows the formation of a dielectric.

On FIG. 3, the structure visible on FIG. 2C is represented after a dielectric formation step has been carried out. A dielectric layer 120 is formed in a conformal manner on the top surface 101, on the first surface 103, and on the side walls of the pillars 104.

Figure 4:
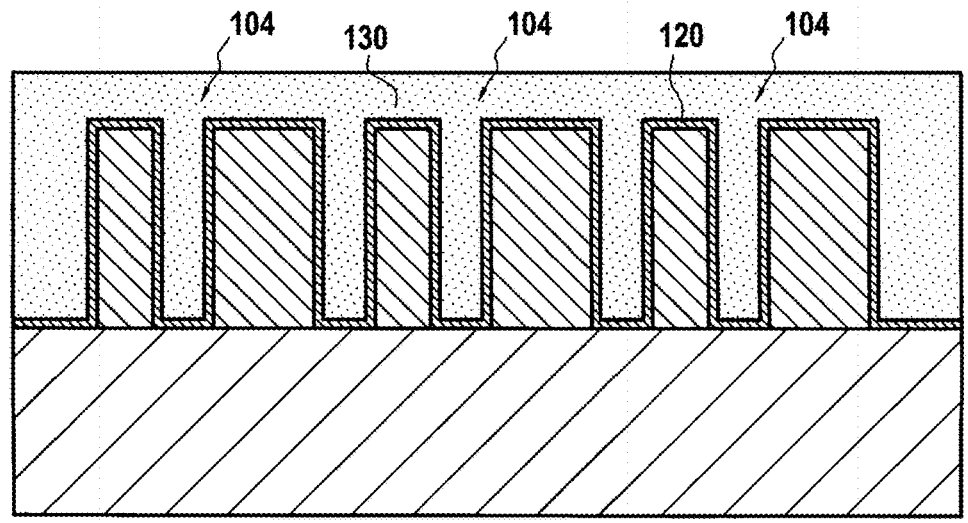
FIG. 4 shows the formation of a second electrode.

On FIG. 4, the structure of FIG. 3 has been represented after a second electrode 130 has been formed in a conformal manner. The second electrode 130 may comprised doped polysilicon. A capacitor is formed by the first electrode (the pillars and the first surface), the dielectric 120, and the second electrode 130.

Because the pillars have a cross-section in the shape of a triskelion, bending of the pillars is very limited and there is no sticking between adjacent pillars even if the aspect ratio of the pillars is greater than 60. This allows performing conformal deposition of the dielectric 120 and of the second electrode 120 which implies greater capacitance density.

In fact, because it is possible, with the structure of the above example, to produce longer pillars, the capacitance density is also improved.

The bending of a pillar may be simulated. By way of example, the inventors have simulated the application of a load of the order of $1 \cdot 10^{-5}$ Newtons at the free end of a pillar having a tripod cross-section (such as a pillar as disclosed in document U.S. Pat. No. 8,283,750) and a length of 60 micrometer can lead to a displacement of the free end of the pillar in a direction which is perpendicular to the direction in which the pillar extends of the order of 1.058 micrometer: this displacement is too high to allow forming pillars of 60 micrometers. The width of the protrusions is, in this example, 1 micrometer.

The same simulation, applied to a pillar having three bent protrusions so that the pillar has a triskelion cross-section, leads to a displacement of only 0.135 micrometer. The width of the protrusions is, in this example, 1 micrometer.

Thus, while the pillars of the prior art showed acceptable displacement at a length of about 50 micrometers, a length of 100 micrometers is acceptable using the present invention. This implies that the capacitance density may be doubled with respect to the prior art, while the mechanical stability is multiplied by 8 for the same length.

Preferably, the length of the pillar may be less than about 120 micrometer, as it has been observed that the displacement may be of the order than 1 micrometer in this case.

Also, it should be noted that the cross-section of the pillars allows arranging the pillars in a matrix, for example as described in reference to FIG. 2A where the matrix is an equilateral triangular tessellation.

ADDITIONAL VARIANTS

Although the present invention has been described above with reference to certain specific embodiments, it will be understood that the invention is not limited by the particularities of the specific embodiments. Numerous variations, modifications and developments may be made in the above-described embodiments within the scope of the appended claims.

The invention claimed is:

1. An electronic product comprising:
   a component having a first electrode comprising a first surface and a pillar extending from the first surface in a first direction, the pillar comprising three protrusions, the three protrusions forming angles of about 120 degrees with each other around a central line of the pillar where the three protrusions meet, wherein the three protrusions are bent in the same direction so that the pillar has a triskelion cross-section in a plane perpendicular to the first direction, and wherein the protrusions each comprise three segments each having the same length and joined by angles of about 120 degrees.

2. The electronic product according to claim 1, wherein the pillar has an aspect ratio greater than 60 or 100, the aspect ratio being the length of a pillar divided by the smallest cross-sectional dimension measured perpendicularly to its length direction.

3. The electronic product according to claim 1, further comprising a plurality of pillars, each central line of a pillar being arranged at a vertex of a planar equilateral triangular tessellation formed in a plane perpendicular to the first direction.

4. The electronic product according to claim 3, wherein the plurality of pillars each have the same orientation.

5. The electronic product according to claim 1, wherein a cross section of the pillar is the same along an entire length of the pillar in the first direction.

6. The electronic product according to claim 1, wherein the pillar has a length which is greater than 60 micrometers.

7. The electronic product according to claim 1, wherein the first electrode is a first electrode of a capacitor of the electronic product.

8. A system comprising an electronic product according to claim 1.

9. A method for fabricating an electronic product according to claim 1.

10. The electronic product according to claim 1, wherein each of the three segments are linear.

11. An electronic product comprising:
a component having a first electrode comprising a first surface and a plurality of pillars extending from the first surface in a first direction, each of the plurality of pillars comprising three protrusions, and each central line the plurality of pillars being arranged at a vertex of a planar equilateral triangular tessellation formed in a plane perpendicular to the first direction, wherein the plurality of pillars each have the same orientation, the three protrusions forming angles of about 120 degrees with each other around a central line where the three protrusions meet, the three protrusions are bent in the same direction so that the plurality of pillars each have a triskelion cross-section in a plane perpendicular to the first direction, and a smallest distance between two parallel segments of protrusions of adjacent pillars is approximately equal to the smallest distance between two parallel segments of protrusions of a same pillar.

12. The electronic product according to claim 11, wherein the protrusions are formed of segments each having a width equal to the smallest distance.

13. The electronic product according to claim 11, wherein the plurality of pillars each have an aspect ratio greater than 60 or 100, the aspect ratio being the length of a respective pillar divided by the smallest cross-sectional dimension measured perpendicularly to its length direction.

14. The electronic product according to claim 11, wherein the protrusions each comprise three segments each having the same length and joined by angles of about 120 degrees.

15. The electronic product according to claim 14, wherein each of the three segments are linear.

16. The electronic product according to claim 11, wherein a cross section of the plurality of pillars is the same along an entire length of the plurality of pillars in the first direction.

17. The electronic product according to claim 11, wherein the plurality of pillars each have a length which is greater than 60 micrometers.

18. The electronic product according to claim 11, wherein the first electrode is a first electrode of a capacitor of the electronic product.

19. A system comprising an electronic product according to claim 11.

20. A method for fabricating an electronic product according to claim 11.

* * * * *